United States Patent
Miyazaki et al.

(10) Patent No.: US 12,188,990 B2
(45) Date of Patent: Jan. 7, 2025

(54) INSPECTION DEVICE AND INSPECTION METHOD USING INSPECTION DEVICE

(71) Applicant: Daifuku Co., Ltd., Osaka (JP)

(72) Inventors: Atsushi Miyazaki, Hinocho (JP); Keiji Nishimura, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 177 days.

(21) Appl. No.: 18/118,878

(22) Filed: Mar. 8, 2023

(65) Prior Publication Data
US 2023/0288493 A1    Sep. 14, 2023

(30) Foreign Application Priority Data

Mar. 9, 2022    (JP) ................ 2022-036474

(51) Int. Cl.
    *G01R 31/40*    (2020.01)
    *H02J 50/00*    (2016.01)
    *H02J 50/10*    (2016.01)

(52) U.S. Cl.
    CPC ............ *G01R 31/40* (2013.01); *H02J 50/005* (2020.01); *H02J 50/10* (2016.02)

(58) Field of Classification Search
None
See application file for complete search history.

(56) References Cited

U.S. PATENT DOCUMENTS

| | | | |
|---|---|---|---|
| 9,555,713 B2 * | 1/2017 | Fujita | B60L 53/20 |
| 12,015,280 B2 * | 6/2024 | Nishimura | H02J 50/10 |
| 2023/0146550 A1 * | 5/2023 | Nunoya | H02J 50/90 |
| | | | 307/104 |
| 2023/0411985 A1 * | 12/2023 | Ninomiya | H02J 7/04 |
| 2024/0128800 A1 * | 4/2024 | Nunoya | H02J 50/40 |
| 2024/0213811 A1 * | 6/2024 | Nishimura | G06F 1/3293 |
| 2024/0266875 A1 * | 8/2024 | Yamamoto | H01R 4/70 |

FOREIGN PATENT DOCUMENTS

| | | | | |
|---|---|---|---|---|
| JP | 200267747 A | | 3/2002 | |
| KR | 20110047247 A | * | 5/2011 | ........ B60L 5/00 |
| KR | 20170022853 A | * | 3/2017 | ........ H02J 50/00 |
| WO | WO-2019069605 A1 | * | 4/2019 | ........ B60L 5/00 |

OTHER PUBLICATIONS

English translation of KR 2011004724 A May 6, 2011 (Year: 2011).*
English translation of KR 20170022853 A Mar. 2, 2017 (Year: 2017).*
English translation of WO 2019069605 A1 (Year: 2019).*

\* cited by examiner

*Primary Examiner* — Jermele M Hollington
(74) *Attorney, Agent, or Firm* — The Webb Law Firm

(57) ABSTRACT

An inspection device includes: an inspection coil disposed between a first feeder line and a second feeder line; and a cover formed to cover a core. The cover includes: a coil cover portion covering the inspection coil; and a projection portion formed to project to both sides at least in a specific radial direction with respect to the coil cover portion. The dimension in the specific radial direction of the coil cover portion is smaller than the design interval between the first feeder line and the second feeder line, and the dimension in the specific radial direction of the projection portion is larger than the design interval.

9 Claims, 11 Drawing Sheets

INSPECTION DEVICE AND INSPECTION METHOD USING INSPECTION DEVICE

CROSS-REFERENCE TO RELATED APPLICATION

This application claims priority to Japanese Patent Application No. 2022-036474 filed Mar. 9, 2022, the disclosure of which is hereby incorporated by reference in its entirety.

BACKGROUND OF THE INVENTION

1. Field of the Invention

The present invention relates to an inspection device intended for a contactless power feeding facility causing a power receiving coil of a power receiver of a mobile object to generate an induced electromotive force by magnetic fields generated by a first feeder line and a second feeder line.

2. Description of the Related Art

Japanese Unexamined Patent Application Publication No. 2002-67747 discloses a power supply facility (contactless power feeding facility) in which a plurality of induction lines (47) each having a first feeder line and a second feeder line through which an alternating current flows is disposed along the moving route of a mobile object (V) (Reference numerals in the brackets in the Description of the Related Art are those in the literature to be referred to). The mobile object (V) moving on the moving route travels with supply of power while transferring the plurality of induction lines (47). The smooth travel of the mobile object (V) requires the stable flowing of an alternating current through each of the induction lines (47). Further, the mobile object (V) moves while transferring the adjacent induction lines (47), and therefore it is also important that the alternating currents of the adjacent induction lines (V) are synchronized for the stable reception of the power feed even in transfer portions.

SUMMARY OF THE INVENTION

As a method for inspecting whether the alternating current flowing through each induction line is appropriate, the determination based on the power fed to the power receiver of the mobile object is conceivable, for example. However, the mobile object needs to be traveled for the inspection, and the mobile object needs to be mounted with measurement devices that are not required for normal operation, and thus it is not easy to perform the inspection. The contactless power feeding facility is an important facility for moving the mobile object and is preferably appropriately inspected and maintained. Further, it is preferable that this inspection can be carried out safely and efficiently on a daily basis.

In view of the above-described background, it is desirable to provide an inspection device having excellent workability and safety in which a contactless power feeding facility is set as an inspection target and to provide an inspection method using the inspection device.

An inspection device in view of the above-described problems is intended for a contactless power feeding facility including: a first feeder line and a second feeder line disposed parallel to each other along a moving route of a mobile object provided with a power receiver; and a power supply configured to supply an alternating current to the first feeder line and the second feeder line, and configured to cause a receiving coil of the power receiver to generate an induced electromotive force by magnetic fields generated by the first feeder line and the second feeder line, and the inspection device includes: an inspection coil disposed between the first feeder line and the second feeder line for inspection and configured to generate the induced electromotive force by the magnetic fields generated by the first feeder line and the second feeder line; a core around which the inspection coil is wound; a pair of output lines individually connected to each of both ends of the inspection coil; and a cover formed to cover the inspection coil and the core with an insulating material having electrical insulation properties, in which, using a direction along the axial center of the inspection coil as the axial direction, a first side in the axial direction as an axial first side, a second side in the axial direction as an axial second side, directions orthogonal to the axial direction as radial directions, and a specific direction among directions along the radial directions as a specific radial direction, the cover includes: a coil cover portion formed to cover the inspection coil; and a projection portion disposed on the axial first side with respect to the coil cover portion and formed to project to both sides at least in the specific radial direction with respect to the coil cover portion, and, using an interval in design between the first feeder line and the second feeder line as a design interval, the dimension in the specific radial direction of the coil cover portion is smaller than the design interval and the dimension in the specific radial direction of the projection portion is larger than the design interval.

When the inspection coil covered with the coil cover portion is disposed between the first feeder line and the second feeder line for inspection, the induced electromotive force is generated in the inspection coil by the magnetic fields generated by the first feeder line and the second feeder line. A voltage generated by this induced electromotive force is output to the pair of output lines. Thus, the detection of the voltage between the pair of output lines enables the inspection of the magnitude of the magnetic fields generated by the first feeder line and the second feeder line and the inspection of whether the alternating current appropriately flows through the first feeder line and the second feeder line. Further, the dimension in the specific radial direction of the coil cover portion is smaller than the design interval and the dimension in the specific radial direction of the projection portion is larger than the design interval. Therefore, the projection portion is disposed at a position facing the first feeder line and the second feeder line from below with an orientation in which the coil cover portion is located above the projection portion in the inspection, for example, so that the inspection coil covered with the coil cover portion can be disposed at an appropriate position between the first feeder line and the second feeder line. It is a matter of course that the projection portion is disposed at a position facing the first feeder line and the second feeder line from above with an orientation in which the coil cover portion is also located below the projection portion, so that the inspection coil covered with the coil cover portion can also be disposed at an appropriate position between the first feeder line and the second feeder line. Further, the cover is formed to cover the inspection coil and the core with the insulating material. Therefore, even when the inspection device contacts the first feeder line or the second feeder line, a short circuit in the first feeder line or the second feeder line is avoided. More specifically, safe inspection can be realized. As described above, according to this configuration, an inspection device having excellent workability and safety in which a contactless power feeding facility is set as an inspection target can be provided. By the use of such an inspection device, an inspection method having excellent workability and safety can be provided.

Further features and advantages of the inspection device and the inspection method using the inspection device will become apparent from the following description of exemplary and non-limiting embodiments described with reference to the drawings.

DESCRIPTION OF THE INVENTION

Figure 1:
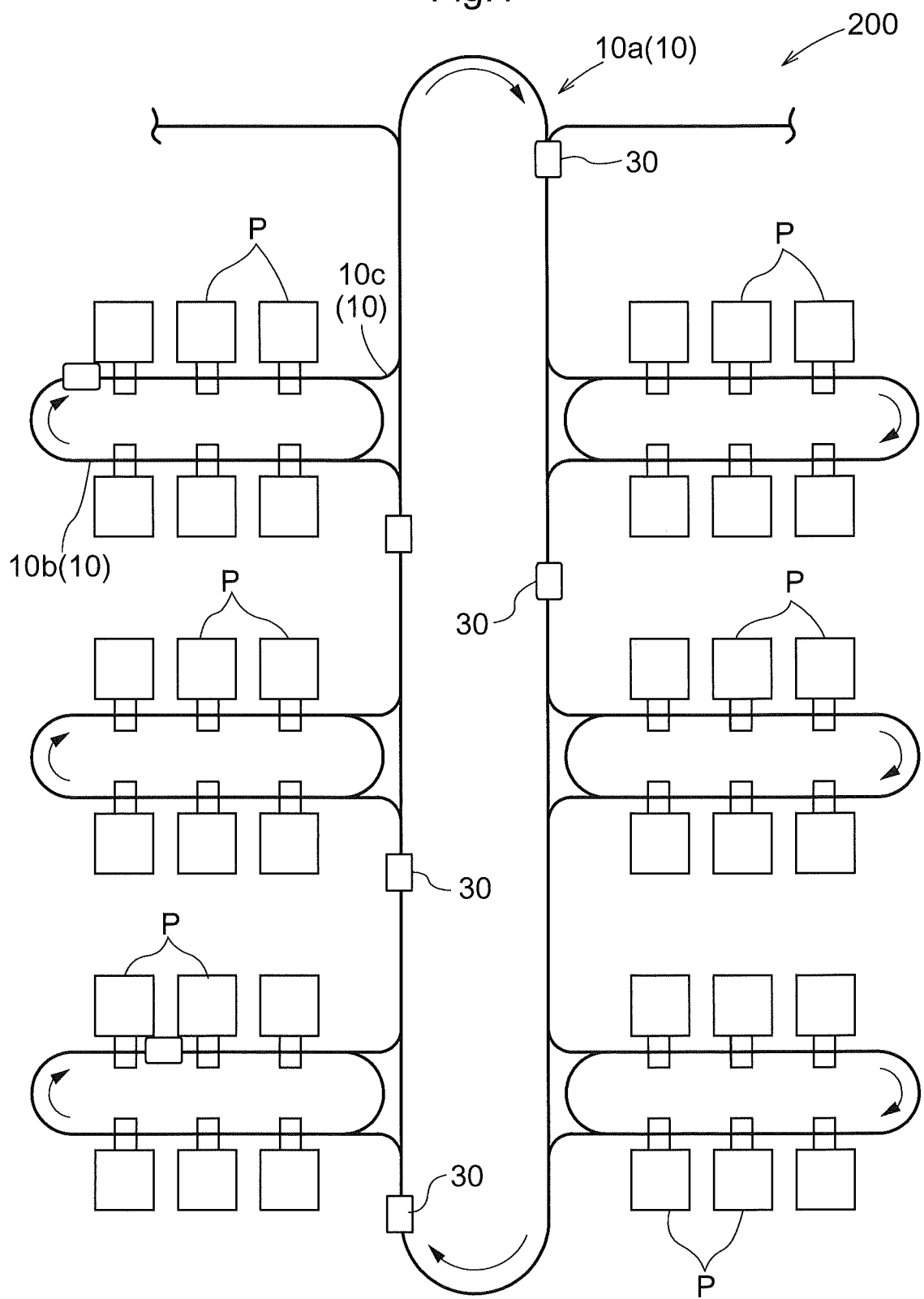
FIG. 1 is a plan view of an article transport facility provided with a contactless power feeding facility.
Figure 2:
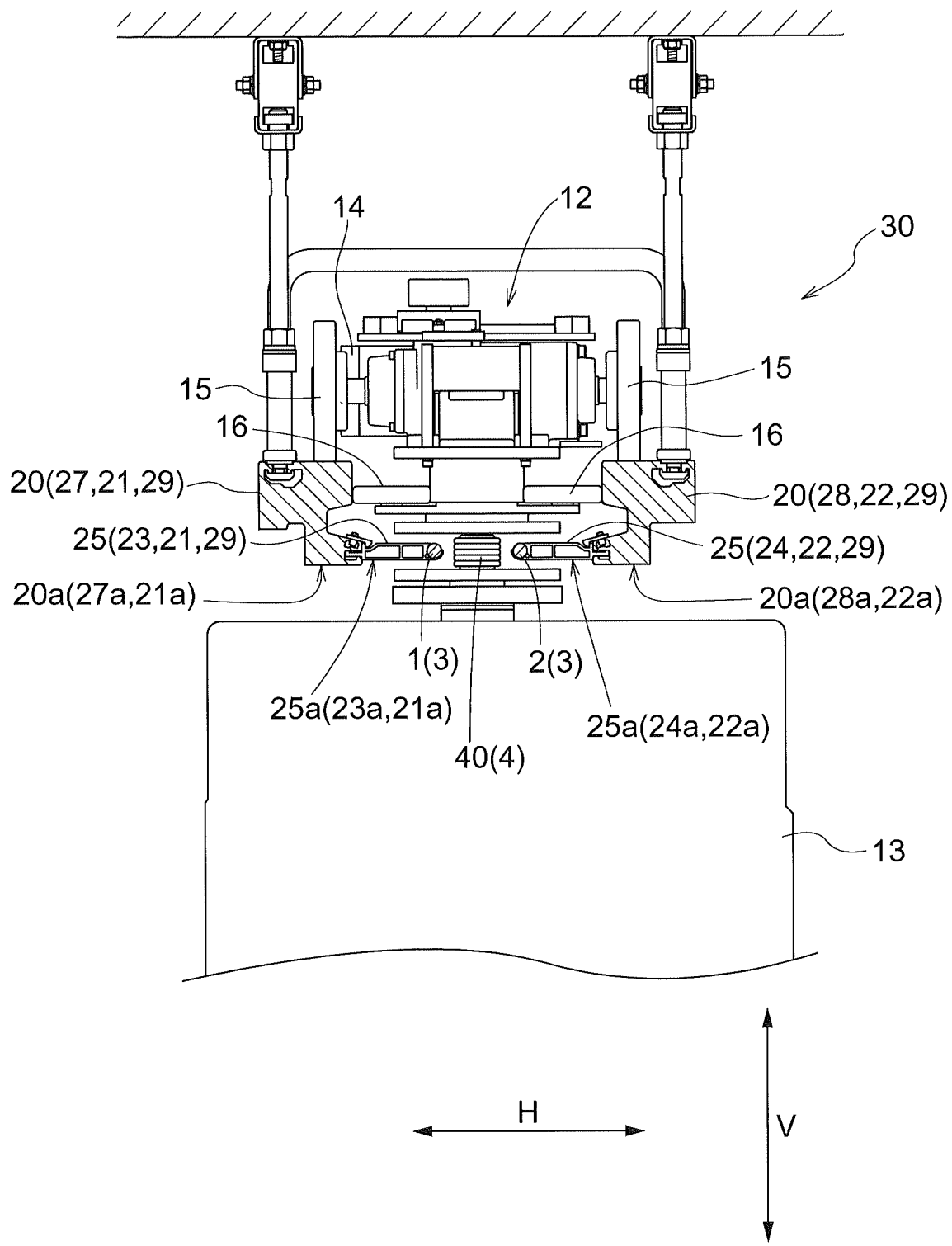
FIG. 2 is a front view of an article transport vehicle.

Hereinafter, embodiments of an inspection device and an inspection method using the inspection device will be described based on the drawings, taking an aspect to be utilized in a contactless power feeding facility in an article transport facility as an example. As illustrated in FIGS. 1 and 2, an article transport facility 200 includes a mobile object 30 and travel rails 20 disposed along moving routes 10 of the mobile object 30. In this embodiment, the mobile object 30 is an article transport vehicle traveling along the moving routes 10 guided by the travel rails 20. For example, the moving routes 10 include one annular main route 10a, annular sub-routes 10b passing through a plurality of article treatment sections P, and connection routes 10c connecting the main route 10a and the sub-routes 10b. In this embodiment, the mobile object 30 travels on the moving routes 10 in one way in the direction indicated by the arrows. In this embodiment, examples of an article to be transported by the mobile object 30 as the article transport vehicle include front opening unified pods (FOUP) housing semiconductor substrates, glass substrates serving as display materials, and the like, for example. The mobile object 30 transports the FOUP with the article treatment sections P applying various kinds of treatment to the semiconductor substrates as the transport destination and the transport source.

As illustrated in FIG. 2, in this embodiment, the mobile object 30 includes: a travel section 12 traveling while being guided by the pair of travel rails 20, forming a pair, disposed to be suspended from and supported by the ceiling; a transport vehicle body 13 located below the travel rails 20 and suspended from and supported by the travel section 12; and a power receiver 4 receiving drive power in a non-contact manner from feeder lines (feeder line set 3 (a set of a first feeder line 1 and a second feeder line 2)) arranged along the travel rails 20. The transport vehicle body 13 includes an article support section (not illustrated) mounted to be vertically movable on the transport vehicle body 13 and supporting the article in a suspended state.

As illustrated in FIG. 2, the travel section 12 includes a pair of travel wheels 15 rotationally driven by an electric drive motor 14. The travel wheels 15 roll on the traveling surface formed by the upper surface of each of the travel rails 20. The travel section 12 further includes a pair of guide wheels 16 freely rotating around the axial center along a vertical direction V (around the vertical axial center) in a state of abutting on the inner surfaces of the pair of travel rails 20. The travel section 12 is configured to include the drive motor 14 for traveling, a drive circuit for the drive motor 14, and the like, and causes the mobile object 30 to travel along the travel rails 20. The transport vehicle body 13 includes an actuator vertically moving the article support section, an actuator driving a gripping section gripping the article and the like, drive circuits for the actuators and the like, for example.

Power to the drive motor 14 and various actuators, drive circuits for driving them, and the like is supplied from the feeder lines (feeder line set 3 (first feeder line 1, second feeder line 2)) to the power receiver 4 in a contactless manner. As described above, the feeder lines supplying the drive power to the mobile object 30 via the power receiver 4 are arranged along the travel rails 20, i.e., along the moving routes 10. In this embodiment, the feeder lines are disposed on both sides in a route width direction H with respect to the power receiver 4. Specifically, the first feeder line 1 and the second feeder line 2 are provided which are disposed parallel to each other along the moving routes 10 of the mobile object 30 provided with the power receiver 4. The first feeder line 1 and the second feeder line 2 connected to a common power supply 5 (described later with reference to FIG. 3) are collectively referred to as the feeder line set 3.

In this embodiment, the drive power is supplied to the mobile object 30 using a wireless power feeding technology referred to as a high efficiency inductive power distribution technology (HID). Specifically, a high-frequency current is caused to flow through the first feeder line 1 and the second feeder line 2, which are induction lines, so that magnetic fields are generated around the first feeder line 1 and the second feeder line 2. The power receiver 4 is configured to include a pickup coil 40 and a magnetic core (no reference numeral because it is hidden by the pickup coil 40 and the like). The pickup coil 40 is induced by electromagnetic induction from the magnetic fields. The induced alternating current power is converted to a direct current by a rectifying circuit, such as a full-wave rectifying circuit, or a receiving circuit (not illustrated) having a smoothing capacitor and the like, and supplied to the actuators and the drive circuits.

Figure 3:
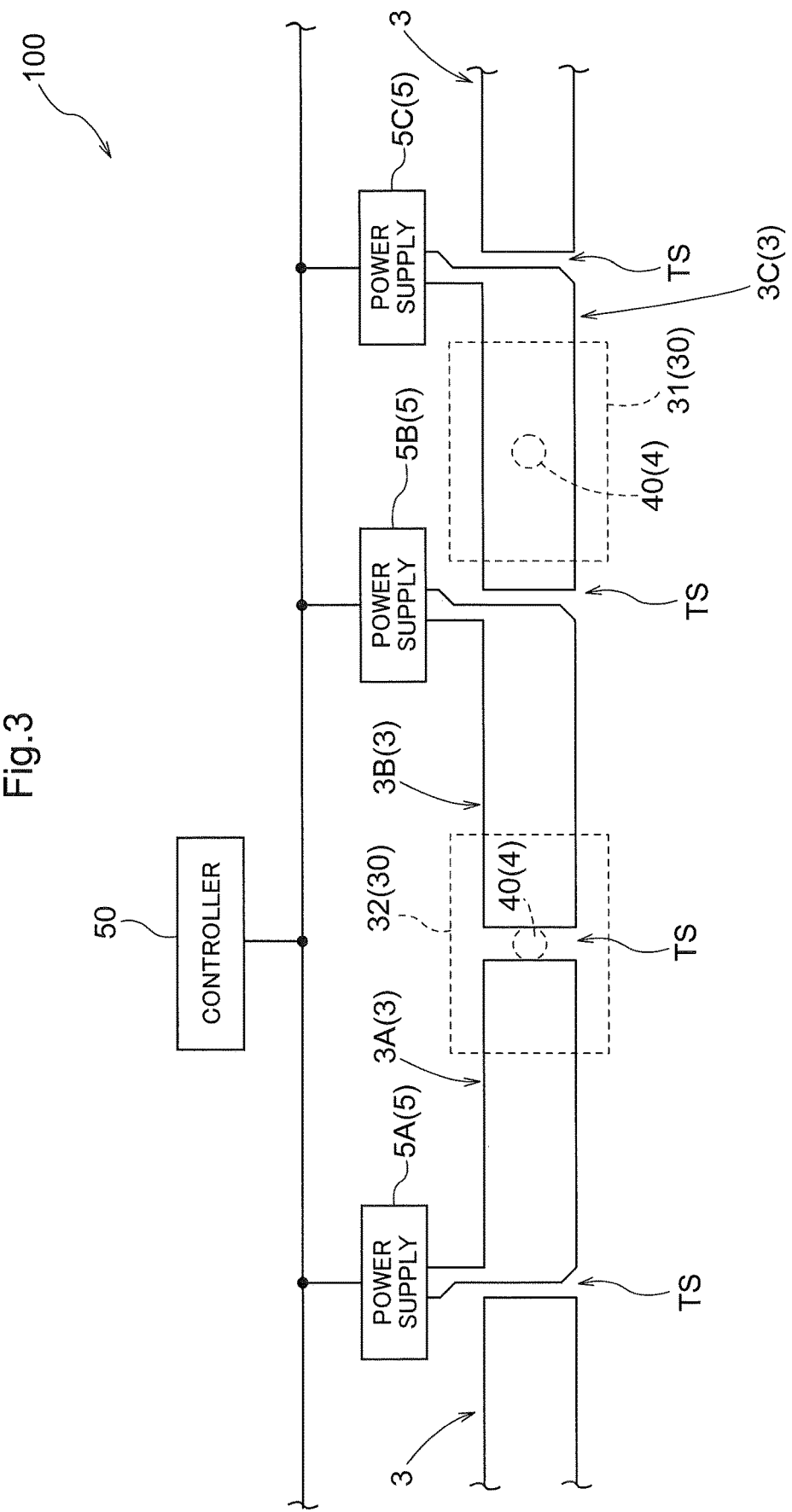
FIG. 3 is a schematic block diagram illustrating the system configuration of the contactless power feeding facility.

The contactless power feeding facility 100 of this embodiment is a facility supplying power to the mobile object 30 in a contactless manner using such a wireless power feeding technology. As illustrated in FIG. 3, the contactless power feeding facility 100 includes power supplies 5 connected to the feeder line sets 3 and supplying alternating currents to the feeder line sets 3, and supplying power to the power receivers 4 in a contactless manner. As illustrated with reference to FIG. 1, the article transport facility 200 includes the one large annular main route 10a and the plurality of annular sub-routes 10b smaller than the main route 10a. As described above, the relatively large-scale article transport facility 200 is provided with not one but a plurality of power supply systems each configured by the feeder line set 3 and the power supply 5 to suppress a reduction in the power transmission efficiency and the stoppage of the entire facility in the event of a failure. The block diagram of FIG. 3 illustrates an aspect in which the plurality of power supply systems is provided, e.g., a first system configured by a first feeder line set 3A and a first power supply 5A, a second system configured by a second feeder line set 3B and a second power supply 5B, a third system configured by a third feeder line set 3C and a third power supply 5C, and the like.

The power supply 5 is mounted with a power supply circuit (not illustrated) configured by a switching power supply circuit as a core including an inverter circuit and a power supply controller (not illustrated) controlling the power supply circuit, for example. The power supply controller controls the duty of a switching control signal of a switching element forming an inverter circuit based on a command value. For example, the power supply controller causes the power supply circuit to output an alternating current by pulse width modulation (PWM). Herein, the command value is a current value (effective value, amplitude, crest value (peak-to-peak value), and the like) or the duty in the PWM control, for example.

The contactless power feeding facility 100 further includes a synchronization system (not illustrated) for synchronizing the phases of alternating currents between the plurality of power supply systems. For example, the contactless power feeding facility 100 includes a controller 50 totally controlling the plurality of power supplies 5, and a synchronization signal is supplied from the controller 50 to each of the power supplies 5. Each of the power supplies 5 includes a synchronous circuit (not illustrated), and the synchronous circuit adjusts the phases of the alternating currents based on the synchronous signal. Thus, even in a case of different power supply systems, the alternating currents having almost the same phase flow through the feeder line sets 3, and the mobile object 30 can be similarly supplied with power also from any power supply system.

The mobile object 30 moving on the moving routes 10 travels with supply of power while transferring the plurality of power supply systems. For example, the mobile object 30 transfers the power supply systems, for example, from the first system configured by the first feeder line set 3A and the first power supply 5A to the second system configured by the second feeder line set 3B and the second power supply 5B passing through a transfer portion TS. When the mobile object 30 is located on one power supply system as in a first mobile object 31 located on the third system in FIG. 3, the mobile object 30 receives power supply from the one power supply system. However, when the mobile object 30 is located between two adjacent power supply systems as in a second mobile object 32 located in the transfer portion TS between the first system and the second system in FIG. 3, the mobile object 30 receives power supply from these two power supply systems.

Figure 4:
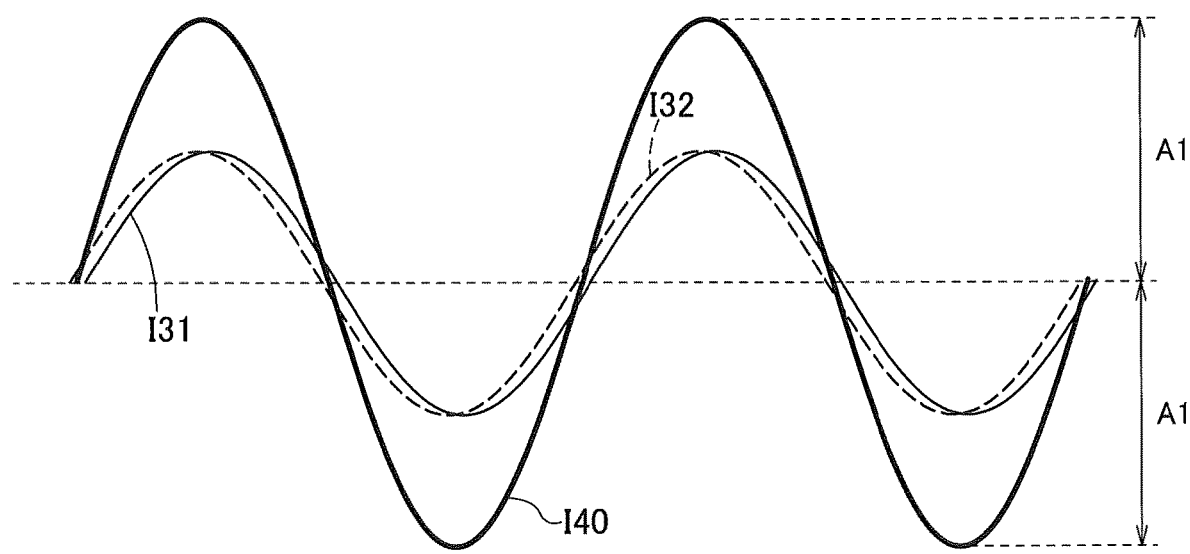
FIG. 4 is a waveform chart illustrating the relationship between the phases (almost synchronized state) of alternating currents of adjacent feeder line sets and a current induced into a pickup coil located in a transfer portion.
Figure 5:
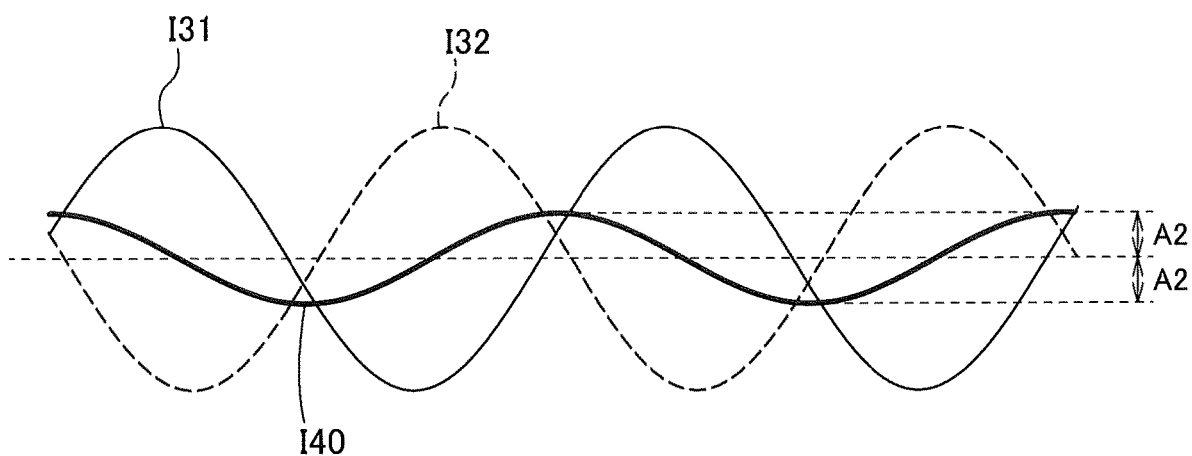
FIG. 5 is a waveform chart illustrating the relationship between the phases (non-synchronized state) of the alternating currents of the adjacent feeder line sets and the current induced into the pickup coil located in the transfer portion.

Herein, the state of synchronization between the first system and the second system and the power received by the second mobile object 32 are considered. As illustrated in FIG. 4, when the phases of an alternating current (I31) flowing through the first feeder line set 3A in the first system and an alternating current (I32) flowing through the second feeder line set 3B in the second system are almost synchronized, an alternating current (induced current 140) with an amplitude of "A1" is induced in the pickup coil 40. However, when the phases of the alternating current (I31) flowing through the first feeder line set 3A and the alternating current (I32) flowing through the second feeder line set 3B are not synchronized as illustrated in FIG. 5, the amplitude of an alternating current (induced current 140) flowing through the pickup coil 40 becomes "A2" smaller than the amplitude "A1" when the phases are synchronized. As a result, there are risks that the moving speed of the mobile object 30 decrease or the mobile object 30 stops in the transfer portion TS.

As described above, the power supply systems are controlled such that the alternating currents are synchronized by the cooperation of the controller 50 and the synchronous circuit in each of the power supplies 5. The synchronous control is carried out according to parameters set according to the physical positional relationship between the controller 50 and each of the power supplies 5, a load in the power supply system (feeder line set 3) to which each of the power supplies 5 supplies power, and the like. However, the parameters become inappropriate in some cases due to the aging of the article transport facility 200 and the contactless power feeding facility 100, load fluctuations, and the like. Further, setting errors, unintended changes, and the like make the parameters inappropriate, cause failures or the like in the synchronous circuit, or cause troubles in wiring lines of the feeder lines in some cases. In such cases, a loss of the synchronization between the power supply systems results in a failure to appropriately supply power to the mobile object 30 in the transfer portion TS in some cases. Further, a failure of the power supplies 5, trouble with the feeder lines, and the like, without being limited to the transfer portion TS, also damage the power supply in a single power supply system in some cases.

The contactless power feeding facility 100 is an important facility for moving the mobile object 30, and is preferably appropriately inspected and maintained. An inspection device 70 of this embodiment described in detail below has excellent workability and safety, and can appropriately inspect the contactless power feeding facility 100.

Figure 6:
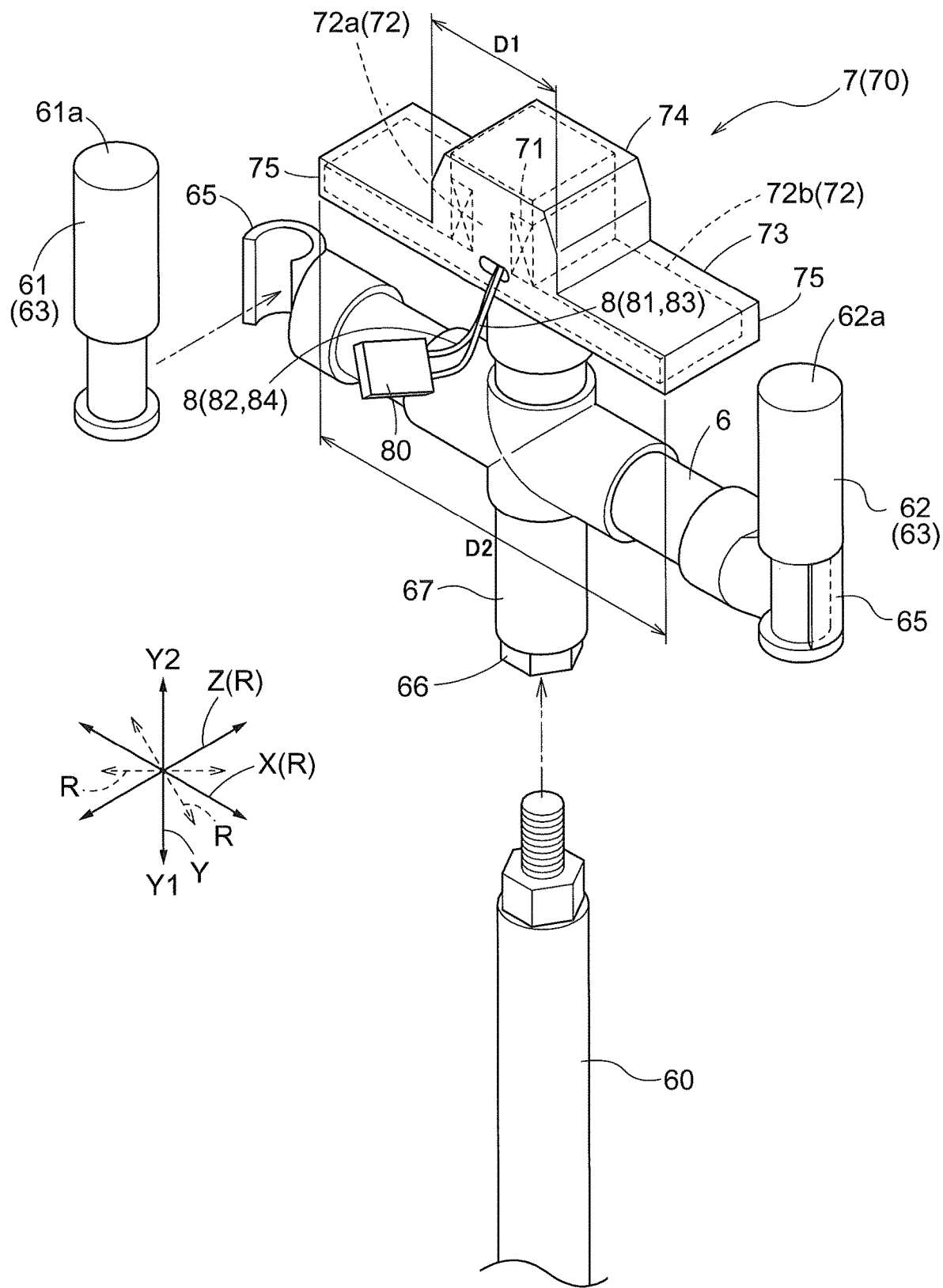
FIG. 6 is a perspective view illustrating an example of an inspection unit (inspection device)
Figure 7:
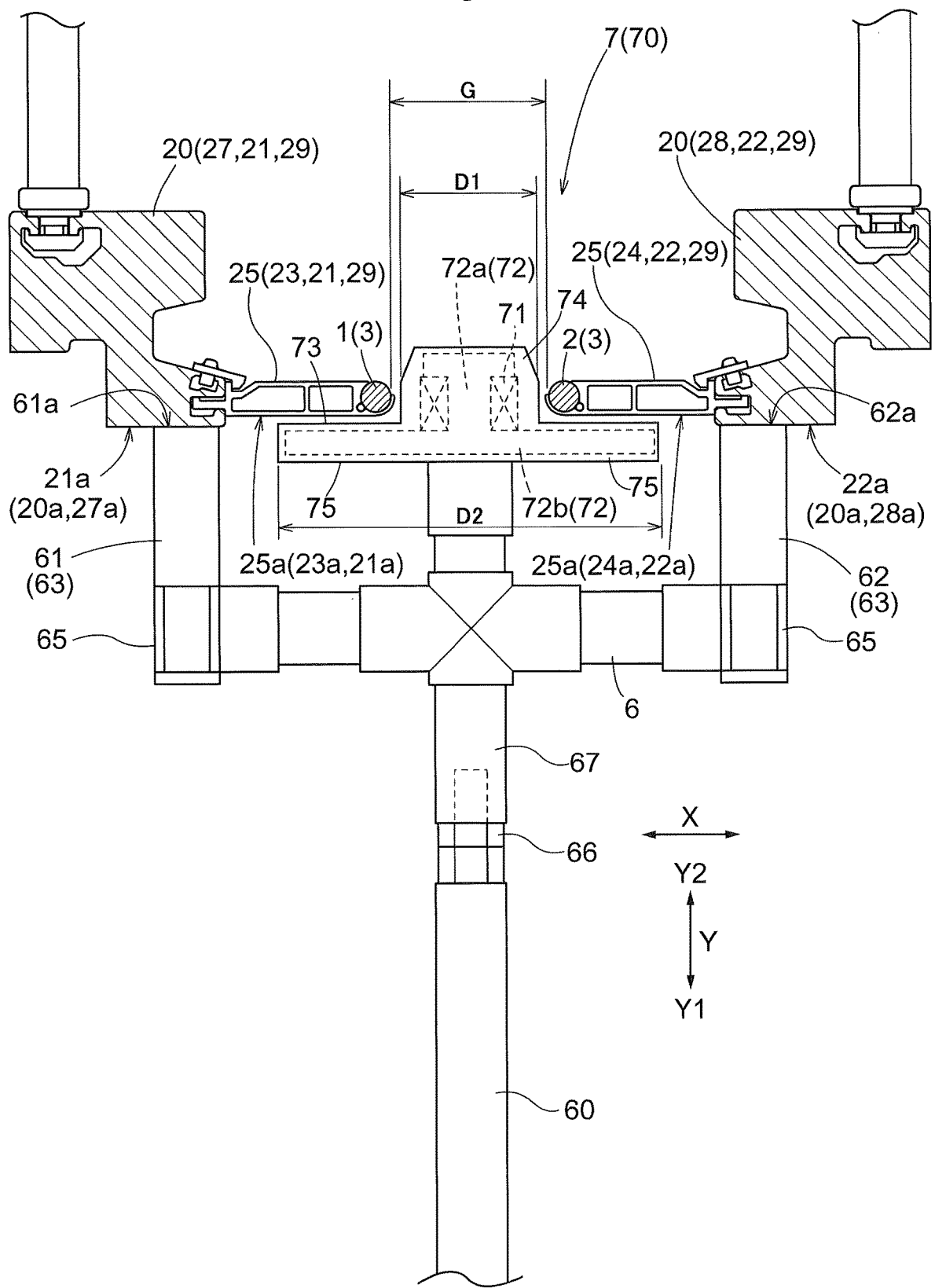
FIG. 7 is a cross-sectional view of the inspection unit (inspection device) in an installed state in inspection.

The perspective view of FIG. 6 illustrates an inspection unit 7 as an example of such an inspection device 70. FIG. 7 illustrates a cross-sectional view of the inspection unit 7 in an installed state in the inspection. The inspection device 70 may be configured by one inspection unit 7 or may be configured by combining two or more of the inspection units 7 (e.g., FIG. 9, FIG. 10, for example), or, when the inspection device 70 contains two or more of the inspection units 7, the two or more of the inspection units 7 may be connected and integrated (e.g., FIG. 11).

As illustrated in FIGS. 6 and 7, the inspection unit 7 includes an inspection coil 71, a core 72, a cover 73, and a pair of output lines 8. The inspection coil 71 corresponds to the pickup coil 40 in the power receiver 4 of the mobile object 30, is disposed between the first feeder line 1 and the second feeder line 2 for inspection, and generates an induced electromotive force by the magnetic fields generated by the first feeder line 1 and the second feeder line 2. The core 72 corresponds to the magnetic core in the power receiver 4 of the mobile object 30, and the inspection coil 71 is wound around the core 72. The cover 73 is a cover member for insulating the inspection coil 71 and the core 72, and is formed to cover the inspection coil 71 and the core 72 with an insulating material having electrical insulation properties. The pair of output lines 8 is individually connected to each of both ends of the inspection coil 71, and a voltage causing an induced current to flow through the inspection coil 71 can be detected via the pair of output lines 8.

Herein, directions along the axial center of the inspection coil 71 are defined as an axial direction Y, a first side of the axial direction Y is defined as an axial first side Y1 and a second side of the axial direction Y is defined as an axial second side Y2. Directions orthogonal to the axial direction Y are defined as radial directions R, and a specific direction among the directions along the radial directions R is defined as a specific radial direction X. Among the radial directions R, a direction orthogonal to the specific radial direction X is defined as a second specific radial direction Z. More specifically, the second specific radial direction Z is a direction orthogonal to both the axial direction Y and the specific radial direction X. The specific radial direction X may also be referred to as a "first specific radial direction".

As illustrated in FIG. 6, the cover 73 includes a coil cover portion 74 and a projection portion 75. The coil cover portion 74 is formed to cover the inspection coil 71. The projection portion 75 is disposed on the axial first side Y1 with respect to the coil cover portion 74 and is formed to project to both sides at least in the specific radial direction X with respect to the coil cover portion 74. Herein, the interval in design between the first feeder line 1 and the second feeder line 2 is defined as a design interval G as illustrated in FIG. 7. The dimension in the specific radial direction X (first dimension D1) of the coil cover portion 74 is smaller than the design interval G. The dimension in the specific radial direction X (second dimension D2) of the projection portion 75 is larger than the design interval G.

As illustrated in FIG. 7, when the inspection coil 71 covered with the coil cover portion 74 is disposed between the first feeder line 1 and the second feeder line 2 for inspection, an induced electromotive force is generated in the inspection coil 71 by the magnetic fields generated by the first feeder line 1 and the second feeder line 2. A voltage generated by the induced electromotive force is output to the pair of output lines 8. Therefore, the detection of the voltage between the pair of output lines 8 enables the inspection of the magnitude of the magnetic fields generated by the first feeder line 1 and the second feeder line 2 and the inspection of whether an alternating current appropriately flows through the first feeder line 1 and the second feeder line 2.

Further, the first dimension D1 is smaller than the design interval G and the second dimension D2 is larger than the design interval G. Therefore, the projection portion 75 is disposed at a position facing the first feeder line 1 and the second feeder line 2 (e.g., see FIG. 10) from below with an orientation in which the coil cover portion 74 is located above the projection portion 75 in the inspection, so that the inspection coil 71 covered with the coil cover portion 74 can be disposed at an appropriate position between the first feeder line 1 and the second feeder line 2. It is a matter of course that the projection portion 75 is disposed at a position facing the first feeder line 1 and the second feeder line 2 from above with an orientation in which the coil cover portion 74 is located below the projection portion 75, so that the inspection coil 71 covered with the coil cover portion 74 can also be disposed at an appropriate position between the first feeder line 1 and the second feeder line 2.

Further, the cover 73 is formed to cover the inspection coil 71 and the core 72 with the insulating material as described above. Therefore, even when the inspection unit 7 contacts the first feeder line 1 or the second feeder line 2, a short circuit in the first feeder line 1 or the second feeder line 2 is avoided, and safe inspection can be realized.

In the aspect illustrated in FIGS. 6 and 7, the core 72 includes: a winding portion 72a which is disposed along the axial direction Y and around which the inspection coil 71 is wound; and a projection core portion 72b disposed on the axial first side Y1 with respect to the winding portion 72a and formed to project to both sides at least in the specific radial direction X with respect to the winding portion 72a. The portion 72a around which the inspection coil 71 is wound is disposed inside the coil cover portion 74 of the cover 73 together with the inspection coil 71. The projection core portion 72b is disposed inside the projection portion 75 of the cover 73.

As described above, the projection portion 75 is disposed at a position facing the first feeder line 1 and the second feeder line 2 from below with an orientation in which the coil cover portion 74 is located above the projection portion 75 in the inspection, for example, so that the inspection coil 71 covered with the coil cover portion 74 can be disposed at an appropriate position between the first feeder line 1 and the second feeder line 2. In this case, the projection core portion 72b of the core 72 is disposed at the position facing the first feeder line 1 and the second feeder line 2 from below in the inspection. Similarly in the opposite case, the projection core portion 72b of the core 72 is disposed at the position facing the first feeder line 1 and the second feeder line 2 from above in the inspection. In any case, the projection core portion 72b can be disposed close to the first feeder line 1 and the second feeder line 2, and therefore the induced electromotive force generated in the inspection coil 71 is easily increased in the inspection and the inspection accuracy is easily enhanced.

Figure 8:
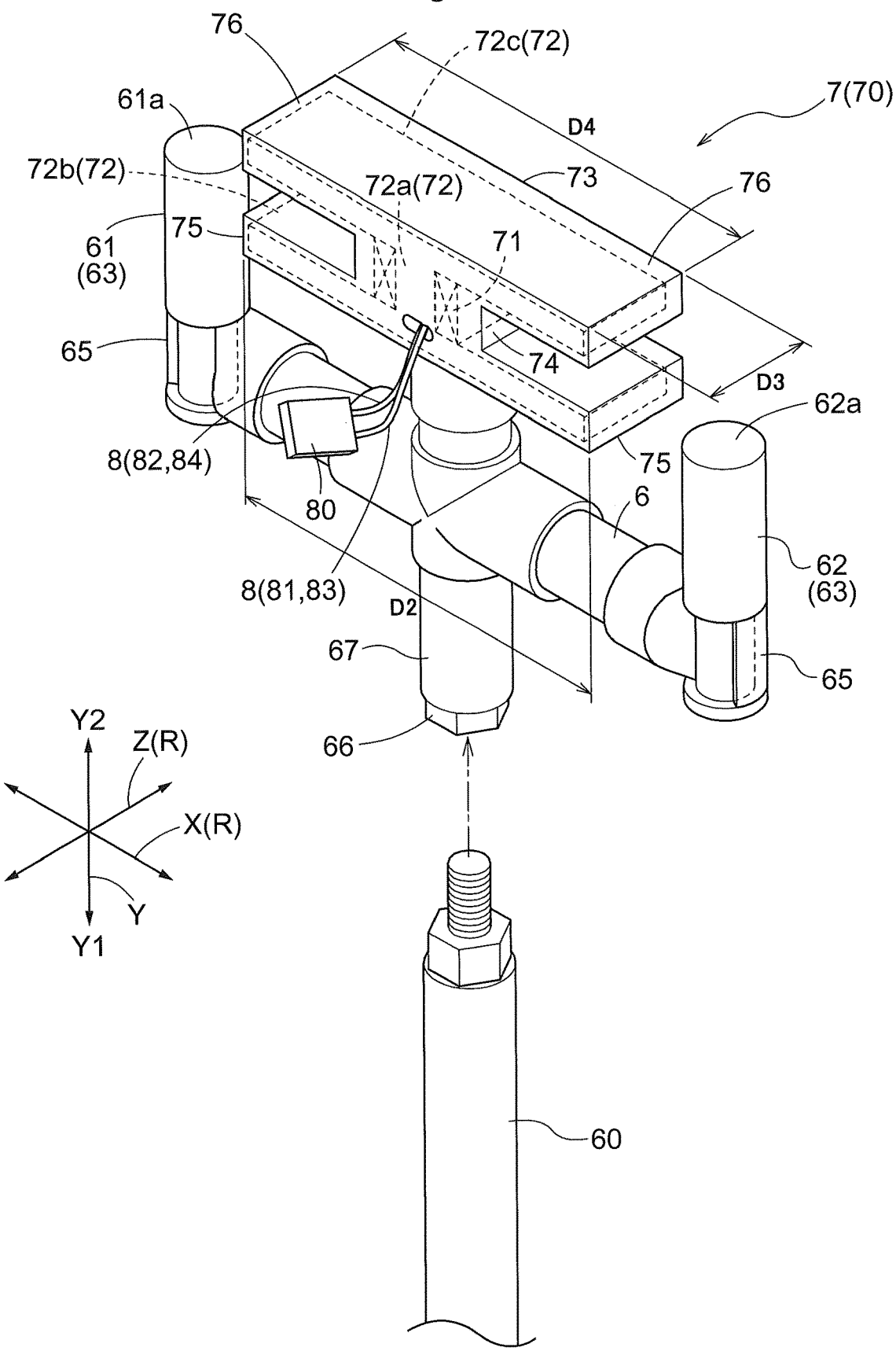
FIG. 8 is a perspective view illustrating another example of the inspection unit (inspection device)

Without being limited to this aspect, the core 72 may include, in addition to the projection core portion 72b (first projection core portion) disposed on the axial first side Y1 with respect to the winding portion 72a, a projection core portion (second projection core portion 72c) disposed on the axial second side Y2 with respect to the winding portion 72a as illustrated in FIG. 8, for example. More specifically, the core 72 may further include the second projection core portion 72c disposed on the axial second side Y2 with respect to the winding portion 72a and formed to project to both sides at least in the specific radial direction X with respect to the winding portion 72a. In this case, the cover 73 suitably further includes, in addition to the coil cover portion 74 and the projection portion 75 (first projection portion) covering the first projection core portion (projection core portion 72b), a projection portion (second projection portion 76) covering the second projection core portion 72c according to the shape of the core 72 as illustrated in FIG. 8. In this aspect, the first projection core portion (projection core portion 72b) and the second projection core portion 72c are disposed to sandwich the feeder line set 3 from both sides in the axial direction Y in the state where the inspection coil 71 is disposed between the first feeder line 1 and the second feeder line 2 in the inspection. Therefore, the induced electromotive force generated in the inspection coil 71 is easily further increased in the inspection and the inspection accuracy is easily enhanced.

In this aspect, the feeder line set 3 is sandwiched with the core 72 from above and below. Therefore, when the inspection unit 7 is disposed from below, for example, the second projection portion 76 is rotated 90° around the axis along the axial direction after the second projection portion 76 passes between the first feeder line 1 and the second feeder line 2, and thus the feeder line set 3 may be sandwiched between the first projection portion (projection portion 75) and the second projection portion 76 from both the sides, above and below. The same applies to a case where the inspection unit 7 is disposed from above. In any case, the dimension (third dimension D3) in the second specific radial direction Z of the second projection portion 76 is smaller than the design interval G in this aspect such that the second projection portion 76 can pass between the first feeder line 1 and the second feeder line 2. In this example, the dimension in the second specific radial direction Z of the coil cover portion 74 is also smaller than the design interval G. More preferably, the maximum dimension in the radial direction R of the coil cover portion 74 is smaller than the design interval G. After the second projection portion 76 passes between first feeder line 1 and the second feeder line 2 and rotates 90° around the axis along the axial direction, the first feeder line 1 and the second feeder line 2, and the second projection portion 76 preferably overlap as viewed in the axial direction Y, and therefore the dimension (fourth dimension D4) in the specific radial direction X of the second projection portion 76 is larger than the design interval G. When the shapes of the cores 72 are symmetrical, it is suitable that the second dimension D2 and the fourth dimension D4 are identical to each other.

As described above, when the projection portion 75 is disposed at the position facing the first feeder line 1 and the second feeder line 2 from below (e.g., see FIG. 10) with the orientation in which the coil cover portion 74 is located above the projection portion 75 in the inspection, the inspection unit 7 is located in a place higher than the height of the eyes of an operator. Also when the projection portion 75 is located at the position facing the first feeder line 1 and the second feeder line 2 from above with the orientation in which the coil cover portion 74 is located below the projection portion 75, the inspection unit 7 is similarly located in a place lower than the height of the eyes of the operator in many cases. More specifically, it is rare that the inspection is performed in a state where the inspection unit 7, the feeder line set 3, and the height of the eyes of the operator are substantially horizontally aligned. Therefore, the inspection unit 7 is preferably configured such that the operator can grasp the positional relationship between the inspection unit 7 and the feeder line set 3 by a method other than visual observation.

As illustrated in FIGS. 2 and 7, the first feeder line 1 and the second feeder line 2 are supported by brackets 25 supported by the travel rails 20. Specifically, the first feeder line 1 is supported by a first bracket 23 supported by a first travel rail 27, and the second feeder line 2 is supported by a second bracket 24 supported by a second travel rail 28. The first bracket 23 and the first travel rail 27 correspond to a first support member 21 supporting the first feeder line 1. The second bracket 24 and the second travel rail 28 correspond to a second support member 22 supporting the second feeder line 2. The first support member 21 and the second support member 22 correspond to a support member 29 supporting the feeder line set 3. The inspection unit 7 is configured to be able to be disposed at an appropriate position with respect to the feeder line set 3 by being guided by the support members 29.

As illustrated in FIGS. 6 to 8, the inspection unit 7 further includes a support body 6 supporting the inspection coil 71, the core 72, and the cover 73. The support body 6 further supports a first abutting member 61 and a second abutting member 62 as abutting members 63 for abutting on the support member 29 and disposing the inspection unit 7 at an appropriate position with respect to the feeder line set 3. The first abutting member 61 includes a first abutting surface 61a abutting on a lower surface 21a of the first support member 21 (herein, a lower surface 27a of the first travel rail 27). The second abutting member 62 includes a second abutting surface 62a abutting on a lower surface 22a of the second support member 22 (herein, a lower surface 28a of the second travel rail 28). Thus, only by causing the first abutting surface 61a of the first abutting member 61 to abut on the lower surface 21a of the first support member 21 and causing the second abutting surface 62a of the second abutting member 62 to abut on the lower surface 22a of the second support member 22, the inspection coil 71 covered with the coil cover portion 74 can be easily disposed at an appropriate position between the first feeder line 1 and the second feeder line 2.

Herein, the aspect is illustrated in which the lower surface 27a of the first travel rail 27 corresponds to the lower surface 21a of the first support member 21, and the lower surface 28a of the second travel rail 28 corresponds to the lower surface 22a of the second support member 22. However, the lower surfaces 25a of the brackets 25 may be set as the lower surfaces of the support members 29, without being limited to the lower surfaces of the travel rails 20. Specifically, it may be acceptable that a lower surface 23a of the first bracket 23 corresponds to the lower surface 21a of the first support member 21, and a lower surface 24a of the second bracket 24 corresponds to the lower surface 22a of the second support member 22. As illustrated in FIGS. 2 and 7, in the case where the upper surfaces of the travel rails 20 and the upper surfaces of the brackets 25 have a planar shape, when the inspection unit 7 is disposed from above with respect to the feeder line set 3, it may be acceptable that the upper surfaces of the support members 29 abut on a first abutting surface 61a and a second abutting surface 62a, so that the inspection coil 71 is disposed at an appropriate position.

The first abutting member 61 and the second abutting member 62 described above may be fixedly provided on the support body 6 or may be individually detachably supported by the support body 6. In this embodiment, the support body 6 is formed with holding portions 65 capable of gripping and holding the abutting members 63. When the first abutting member 61 and the second abutting member 62 are attachable to and detachable from the support body 6, the first abutting member 61 and the second abutting member 62 can be easily replaced with those having different shapes or removed. For example, it is also considered that at least one of the first abutting member 61 and the second abutting member 62 becomes an obstacle depending on the structure, the inspection place, and the like of the contactless power feeding facility 100. In such a case, the inspection can be flexibly carried out by removing at least one of the first abutting member 61 and the second abutting member 62, which becomes an obstacle. More specifically, the first abutting member 61 and the second abutting member 62 having appropriate shapes depending on the structure, the inspection place, and the like of the contactless power feeding facility 100 are usable, and therefore the inspection unit 7 (inspection device 70) can be shared.

This embodiment illustrates the aspect in which the inspection unit 7 includes the first abutting member 61 and the second abutting member 62, also including the aspect in which the first abutting member 61 and the second abutting member 62 are individually detachably supported by the support body 6. However, when the operator can easily confirm the positional relationship between the feeder line set 3 and the inspection unit 7 by the visual observation or the like, the inspection unit 7 may be configured without including the first abutting member 61 and the second abutting member 62.

When the mobile object 30 is an overhead carrier vehicle as in this embodiment, the travel rails 20 and the feeder line set 3 are generally disposed on the ceiling side and located in a place higher than the height of the operator in many cases. Therefore, the inspection unit 7 is suitably detachably provided with an extension member 60 as illustrated in FIGS. 6 to 8. The support body 6 includes a handle portion 67 extending along the axial direction Y on the axial first side Y1 with respect to the inspection coil 71 and the core 72. The operator disposes the inspection unit 7 with respect to the feeder line set 3 by grasping this handle portion 67. The extension member 60 is attachable to and detachable from a tip portion on the axial first side Y1 of the handle portion 67. More specifically, the support body 6 includes a connection portion 66 which is disposed on the axial first side Y1 with respect to the inspection coil 71 and the core 72 and to which the extension member 60 is detachably connected. In this embodiment, the connection portion 66 is provided on the axial first side Y1 of the handle portion 67 as described above. The extension member 60 is formed to extend from the support body 6 to the axial first side Y1 along the axial direction Y in a state of being connected to the connection portion 66. The extension member 60 may be a member extending and contracting in the axial direction Y without being limited to one having a fixed length.

The connection portion 66 is formed with a female thread, for example, and the tip of the extension member 60 is formed with a male thread screwed with the connection portion 66. The extension member 60 is connected to the connection portion 66 by screwing the female thread and the male thread with each other. As the extension member 60, a monopod connected to a camera is usable, for example. By making it possible to utilize a general-purpose member as the extension member 60, the procurement cost of members can be reduced and the convenience can be enhanced. It is a matter of course that the inspection unit 7 may be configured without including such an extension member 60.

Figure 9:
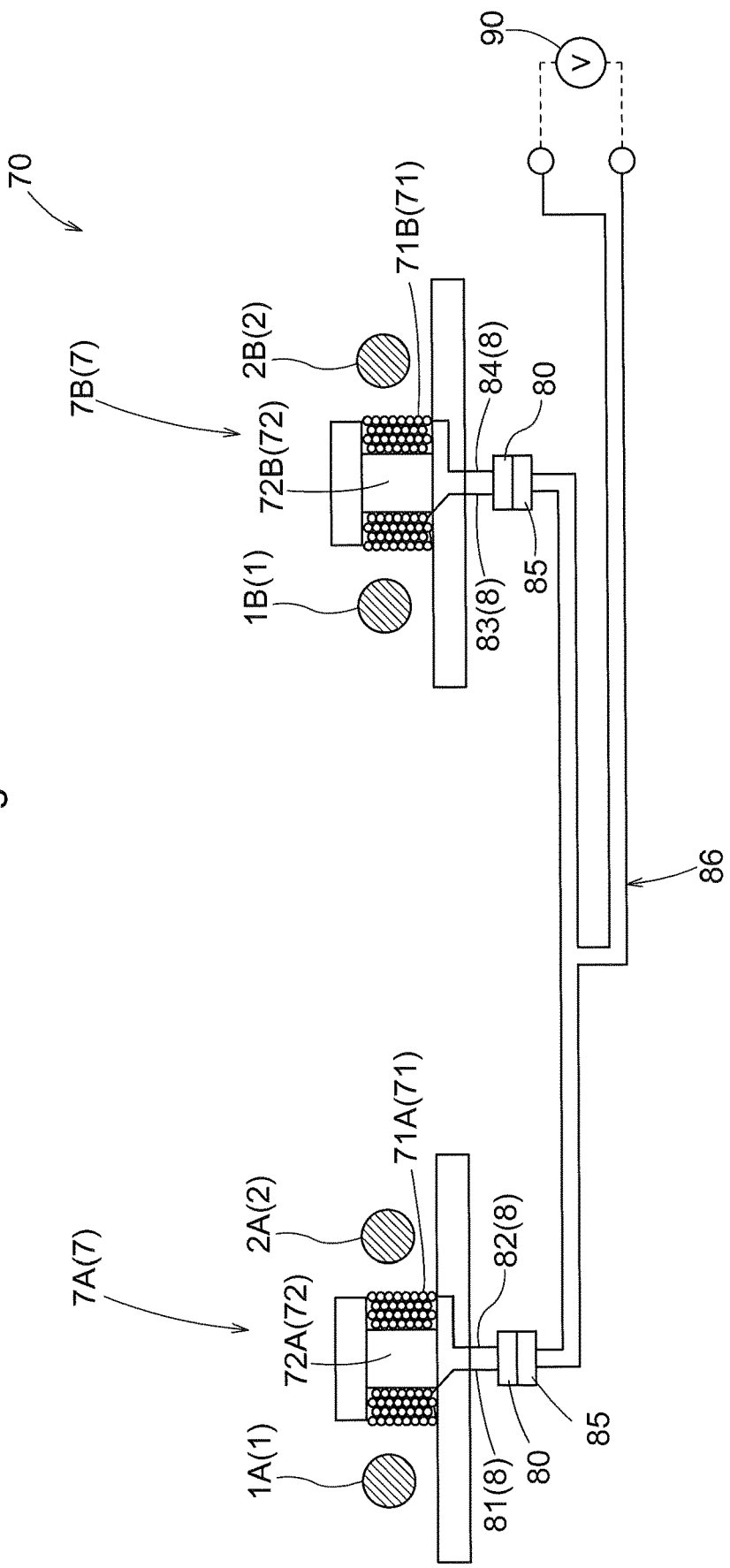
FIG. 9 is a view illustrating a connection example of the inspection units when inspection is performed in the transfer portion.

When the synchronous state between the adjacent power supply systems is inspected in the transfer portion TS, the inspection device 70 is configured using two inspection units 7 as illustrated in FIG. 9. For distinction, one inspection unit 7 is referred to as a first inspection unit 7A, and the other inspection unit 7 is referred to as a second inspection unit 7B. The first inspection unit 7A and the second inspection unit 7B have the same configuration. More specifically, these inspection units 7 include inspection coils 71 (first inspection coil 71A, second inspection coil 71B) and cores 72 (first core 72A, second core 72B). The first inspection coil 71A is disposed between the first feeder line 1 (1A) and the second feeder line 2 (2A) of the first system and the second inspection coil 71B is disposed between the first feeder line 1 (1B) and the second feeder line 2 (2B) of the second system, and individually generate an induced electromotive force by the magnetic fields generated by the first feeder line 1 and the second feeder line 2.

The pair of output lines 8 of the first inspection unit 7A is individually referred to as a first output line 81 and a second output line 82. The pair of output lines 8 of the second inspection unit 7B is individually referred to as a third output line 83 and a fourth output line 84. The second output line 82 of the first inspection unit 7A and the third output line 83 of the second inspection unit 7B are connected such that the inspection coil 71 (first inspection coil 71A) of the first inspection unit 7A and the inspection coil 71 (second inspection coil 71B) of the second inspection unit 7B are connected in series in the same winding direction. The first output line 81 of the first inspection unit 7A and the fourth output line 84 of the second inspection unit 7B are connected to a tester 90 having at least the function of a voltmeter.

As illustrated in FIG. 9, the pair of output lines 8 of each of the inspection units 7 is connected to an output connector 80. Connection cables 86 connected to the tester 90 include connection connectors 85 individually connected to the pair of output lines 8 of the first inspection unit 7A and the pair of output lines 8 of the second inspection unit 7B. The second output line 82 and the third output line 83 are electrically connected via the connection cables 86 by connecting the output connector 80 of each of the inspection units 7 and the connection connector 85 of each of the connection cables 86. The first output line 81 and the fourth output line 84 are connected to the tester 90 via the connection cables 86. More specifically, at least a voltmeter is connected between the first output line 81 of the first inspection unit 7A and the fourth output line 84 of the second inspection unit 7B.

Figure 10:
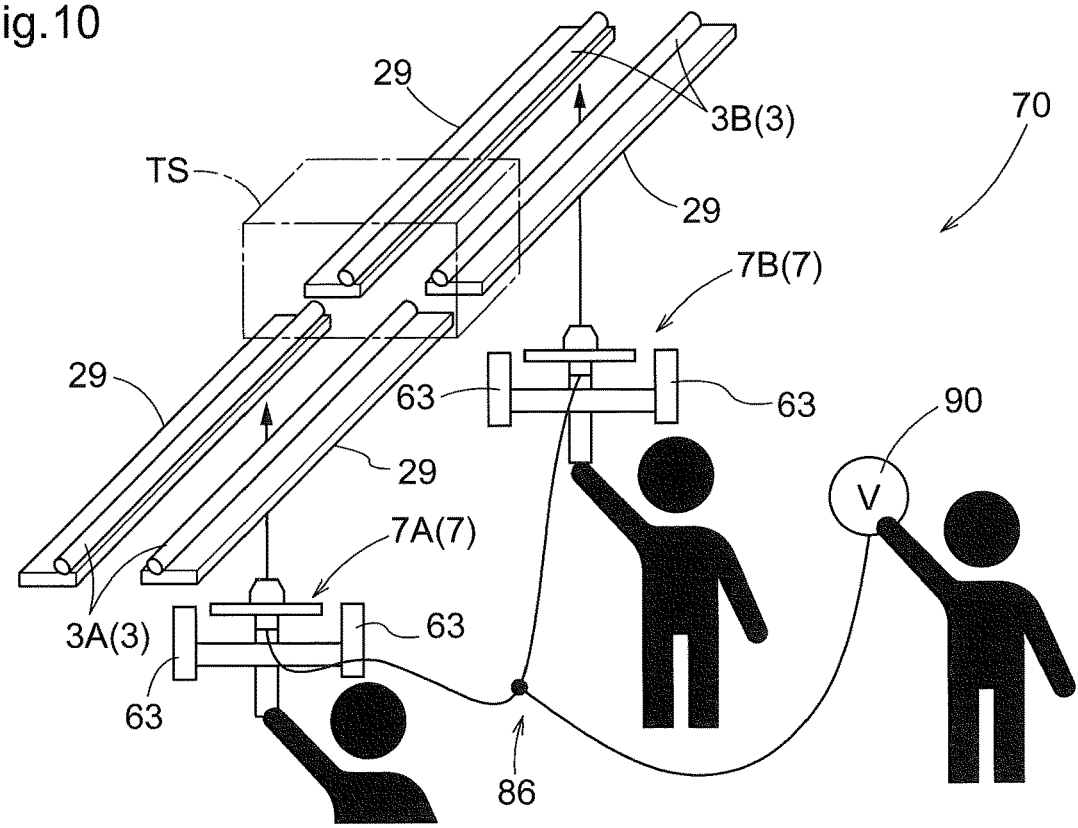
FIG. 10 is a view illustrating an example of inspection work in the transfer portion.

As described above with reference to FIG. 3, two or more of the feeder line sets 3, which is a set of the first feeder line 1 and the second feeder line 2, are disposed side by side along the moving routes 10 in the contactless power feeding facility 100. As illustrated in FIGS. 3 and 10, the first feeder line set 3A and the second feeder line set 3B are disposed adjacently to each other. Herein, the abutting members 63 of each of the inspection units 7 are caused to abut on the support members 29 from below, and the inspection coil 71 of each of the inspection units 7 is disposed between the first feeder line 1 and the second feeder line 2. Then, the measurement of the voltage between the first output line 81 of the first inspection unit 7A and the fourth output line 84 of the second inspection unit 7B enables the inspection of the synchronization state between the adjacent power supply systems in the transfer portion TS.

Herein, in performing the inspection, a step of disposing the inspection coil 71 (first inspection coil 71A) of the first inspection unit 7A between the first feeder line 1 and the second feeder line 2 of the first feeder line set 3A and disposing the inspection coil 71 (second inspection coil 71B) of the second inspection unit 7B between the first feeder line 1 and the second feeder line 2 of the second feeder line set 3B is referred to as an inspection unit disposing step. A step of measuring, after the inspection unit disposing step, the voltage between the first output line 81 of the first inspection unit 7A and the fourth output line 84 of the second inspection unit 7B is referred to as a voltage measurement step. More specifically, in the inspection method for inspecting the contactless power feeding facility 100 using the inspection device 70, the inspection unit disposing step and the voltage measurement step are carried out.

As illustrated in FIG. 10, by individually disposing the first inspection unit 7A and the second inspection unit 7B in two different places in a direction along the moving routes 10, for example, the relationship between the induced electromotive forces generated in the inspection coils 71 in the two places can be inspected. As described above with reference to FIGS. 3 to 5, in the case where the first feeder line set 3A supplied with an alternating current from the first power supply 5A and the second feeder line set 3B supplied with an alternating current from the second power supply 5B are disposed side by side along the moving routes 10 of the mobile object 30, for example, when the phases of the alternating currents of the first feeder line set 3A and the second feeder line set 3B are significantly shifted, the voltage between the first output line 81 and the fourth output line 84 is low. Therefore, the presence or absence of a state in which the power receiver 4 may cause a shortage of the received power amount can be appropriately inspected.

Figure 11:
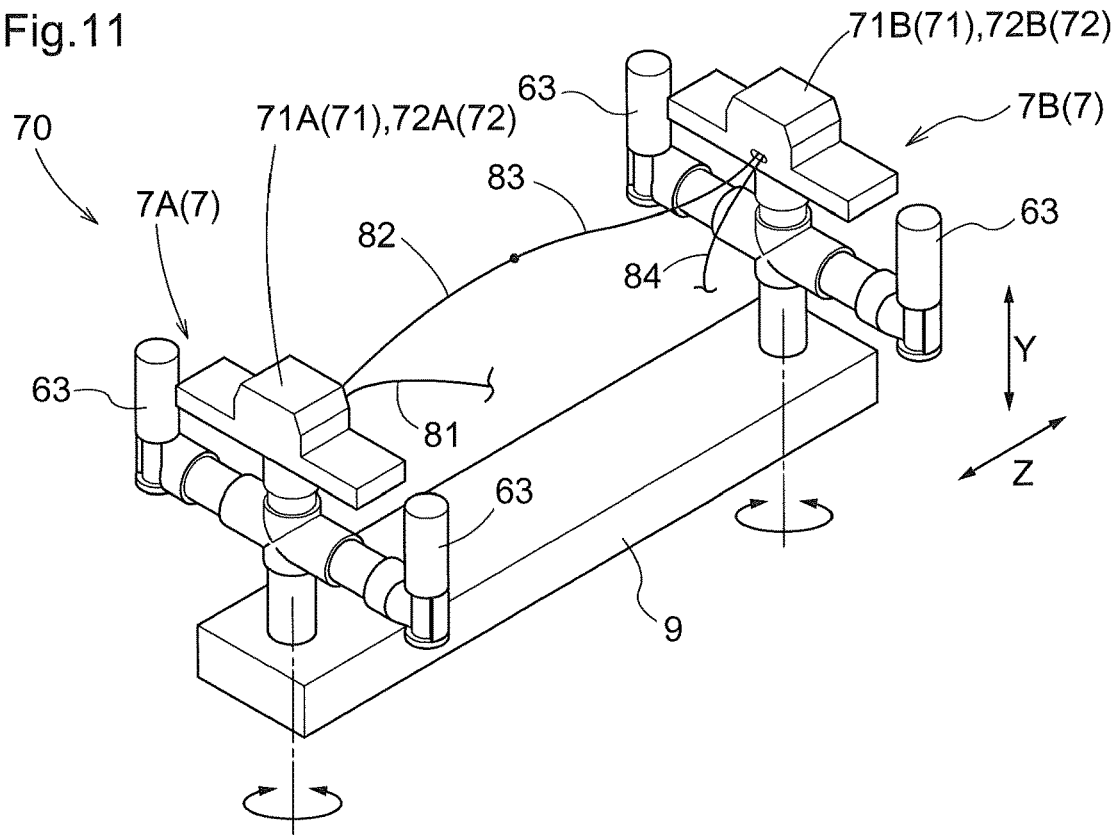
FIG. 11 is a view illustrating an example of an inspection device in which two inspection units are connected.

As illustrated in FIG. 10, two or more of the operators, the operator holding the first inspection unit 7A and the operator holding the second inspection unit 7B, are required in performing such an inspection. When it is not configured to automatically record outputs of the tester 90, an operator for recording the outputs of the tester 90 is also required in some cases. Therefore, it may be acceptable that a connection body 9 connecting the first inspection unit 7A and the second inspection unit 7B is provided, and the first inspection unit 7A and the second inspection unit 7B are connected, so that one inspection device 70 is configured as illustrated in FIG. 11, for example. The connection of the first inspection unit 7A and the second inspection unit 7B with the connection body 9 also enables one operator to hold both the inspection units 7A and 7B. Therefore, the number of the operators in the inspection is easily kept small.

In the aspect illustrated in FIG. 11, the first inspection unit 7A is supported to be rotatable around the axial center along the axial direction Y with respect to the connection body 9, and the second inspection unit 7B is supported to be rotatable around the axial center along the axial direction Y with respect to the connection body 9. The places to be inspected by the inspection units 7 are not always disposed side by side on a straight line as illustrated in FIG. 10. More specifically, the moving routes 10 include not only straight lines but also curved routes as illustrated in FIG. 1. Since the first inspection unit 7A and the second inspection unit 7B are rotatable with respect to the connection body 9, the inspection units 7 can be appropriately disposed in two places even in a place where the moving routes 10 are curved.

Figure 12:
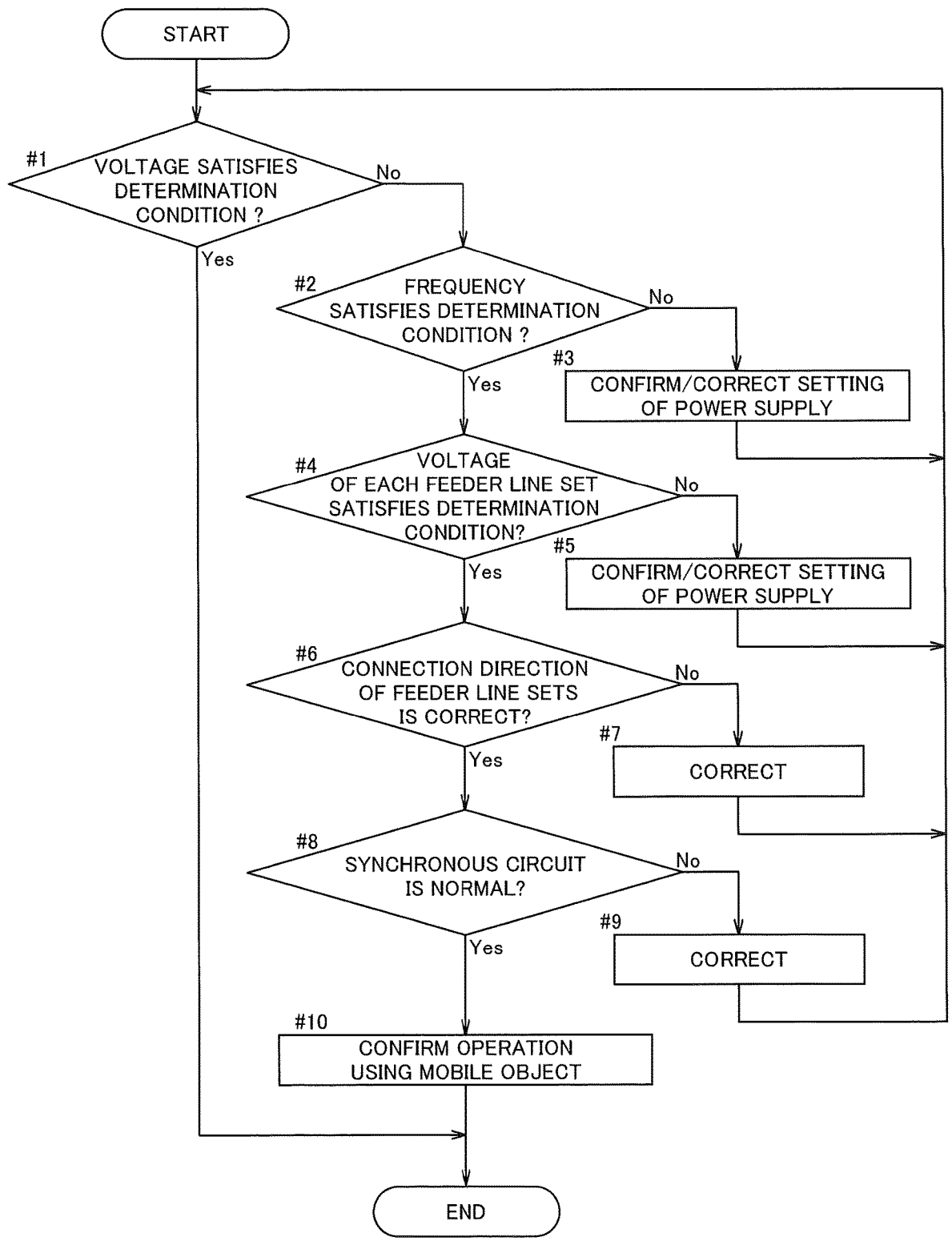
FIG. 12 is a flow chart illustrating an example of determination in inspection.

The flowchart in FIG. 12 illustrates an example of the determination in the inspection. First, it is determined whether the voltage (effective value) measured by the tester 90 satisfies the determination condition (#1). FIGS. 4 and 5 illustrate current waveforms, in which, when the two feeder line sets 3 are not synchronized, the voltage is similarly lower than that when the two feeder line sets 3 are synchronized. For example, when the measured voltage is equal to or larger than a determination voltage (first determination voltage) prescribed in advance by an experiment or a simulation, it is determined that the synchronization is established and the voltage is normal, and the inspection is ended.

When the measured voltage is less than the determination voltage, it is determined whether the frequency of an alternating voltage (the same applies to the frequency of the alternating current) satisfies the determination condition (#2). In addition to whether the synchronization is established, when the power supply 5 has some trouble, for example, the frequency of the alternating voltage deviates from the set frequency prescribed in advance in some cases. The tester 90 of this embodiment can also measure the frequency, and it is determined whether the frequency measured by the tester 90 falls within a prescribed deviation range from the set frequency (within an allowable frequency range prescribed in advance). When it is determined that the frequency deviates, the operator confirms a setting of the power supply 5 and, when there is an error, corrects the setting (#3). When a failure is found, the operator repairs the failure. When it is determined that the frequency does not deviate, another factor is verified.

When it is determined in Step #2 that the frequency does not deviate, it is determined whether the output voltage of the inspection unit 7 in each feeder line set 3 satisfies the determination condition (#4). In this case, instead of the aspect illustrated in FIGS. 9 to 11, the pair of output lines 8 of one inspection unit 7 is connected to the tester 90, and the output voltages from the first inspection unit 7A and the second inspection unit 7B are determined. As described above with reference to FIG. 9, the pair of output lines 8 of each of the inspection units 7 is connected to the output connector 80. Then, the output connectors 80 and the connection connectors 85 are connected, so that the second output line 82 and the third output line 83 are electrically connected. Therefore, by removing the connection cables 86 from the output connectors 80, the voltage between the pair of output lines 8 of each of the inspection units 7 can be measured. An aspect may be acceptable in which a measurement cable (not illustrated), in place of the connection cable 86, is connected to the output connector 80 of each of the inspection units 7 and the pair of output lines 8 is connected to the tester 90 via the measurement cable.

The determination of the output voltage from each of the inspection units 7 enables the determination of whether the power supply 5 of each of the two systems is normally operating. For example, when the measured voltage is equal to or larger than a determination voltage (second determination voltage) prescribed in advance by an experiment or a simulation, the power supplies 5 are determined to be normal. When any of the power supplies 5 is determined not to be normal, the operator confirms a setting of the power supply 5 and, when there is an error, corrects the setting (#5). When a failure is found, the operator repairs the failure. When both the output voltages are determined to be normal, still another factor is verified.

Figure 13:
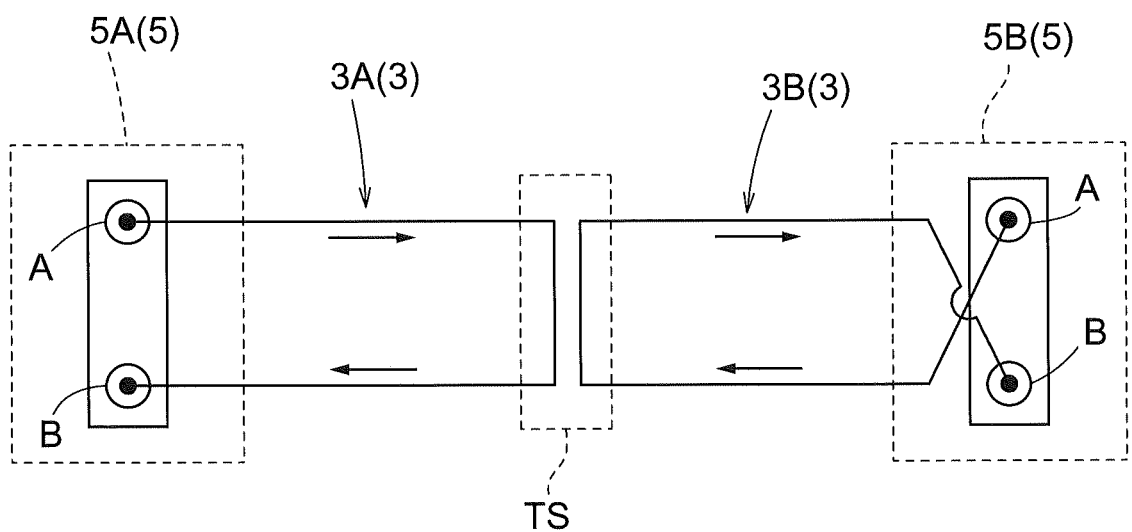
FIG. 13 is a view illustrating a connection example of feeder lines.

When it is determined in Step #4 that the output voltages are normal, it is determined whether the connection direction of the feeder line set 3 is correct (#6). FIG. 13 illustrates a connection aspect of the feeder line sets 3 to the power supplies 5. As illustrated in FIG. 13, there is a necessity of connecting the feeder lines to the power supplies 5 with opposite polarities such that currents flow in the same direction in the adjacent systems in some cases. For example, the direction in which a current flows is indicated by an arrow or the like in the feeder line, and the operator confirms whether the connection direction of the feeder line is correct. When there is an error in the connection direction, the operator corrects the connection of the feeder line (#7).

When it is confirmed in Step #6 that the connection direction of the feeder line is correct, it is nest determined whether the synchronous circuits in the power supplies 5 are normal (#8). When there is an error in a synchronous circuit setting, the operator corrects the synchronous circuit setting (#9). When a failure and the like occur, the operator repairs the failure and the like. When the synchronous circuits are determined to be normal in Step #8, the inspection using the inspection device 70 is ended, and the operation confirmation using the mobile object 30 is carried out (#10).

OTHER EMBODIMENTS

Hereinafter, other embodiments are described. The configuration of each embodiment described below is not limited to being applied alone and can be applied in combination with the configurations of other embodiments insofar as no contradiction arises.

(1) The description above illustrates the aspect in which the inspection device 70 has the two inspection units 7, and determines the synchronization of the currents flowing through the adjacent feeder line sets 3. However, the inspection device 70 is not limited to the use for determining the synchronization as described above and may be used as the inspection device 70 individually inspecting each of the power supplies 5 and the feeder line sets 3. In such a case, one inspection unit 7 may configure one inspection device 70.

(2) The description above illustrates the aspect in which the projection core portion 72b (first projection core portion) is provided, and the projection core portion 72b is disposed inside the projection portion 75 of the cover 73 as illustrated in FIG. 6, for example. However, the core 72 may not include the projection core portion 72b. For example, the core 72 may be disposed only in a part around which the inspection coil 71 is wound. In this case, the core 72 is not disposed inside the projection portion 75 of the cover 73, for example. Therefore, the core 72 may or may not be housed inside the projection portion 75.

(3) The description above illustrates the aspect in which the projection core portion 72b (first projection core portion) projects in the specific radial direction X as illustrated in FIG. 6, for example. However, the projection core portion 72b may project at least in the specific radial direction X with respect to the winding portion 72a and may also project in the other directions among the radial directions R. For example, the projection core portion 72b may have a cross shape projecting in both the specific radial direction X and the second specific radial direction Z. Further, the projection core portion 72b may be formed in a flange shape (circular shape, for example, as viewed from a direction along the axial direction Y) projecting all around in the radial directions R. The projection portion 75 of the cover 73 may also project at least in the specific radial direction X with respect to the coil cover portion 74 and may also project in the other directions among the radial directions R. The projection portion 75 of the cover 73 may also be formed in the cross shape projecting in both the specific radial direction X and the second specific radial direction Z or the flange shape projecting all around in the radial directions R. Preferably, the projection portion 75 has such a shape that the projection core portion 72b can be disposed inside the projection portion 75.

(4) The description above illustrates the aspect in which the cover 73 entirely covers the inspection coil 71 and the core 72. However, the cover 73 may cover at least parts facing the feeder line sets 3 in the disposition attitude when the inspection is performed.

Outline of Embodiments

Hereinafter, the outline of the inspection device and the inspection method using the inspection device described above will be briefly described.

As one suitable aspect, an inspection device, which is intended for a contactless power feeding facility including: a first feeder line and a second feeder line disposed parallel to each other along a moving route of a mobile object provided with a power receiver; and a power supply configured to supply an alternating current to the first feeder line and the second feeder line, and configured to cause a receiving coil of the power receiver to generate an induced electromotive force by magnetic fields generated by the first feeder line and the second feeder line, and the inspection device includes: an inspection coil disposed between the first feeder line and the second feeder line for inspection and configured to generate the induced electromotive force by the magnetic fields generated by the first feeder line and the second feeder line; a core around which the inspection coil is wound; a pair of output lines individually connected to each of both ends of the inspection coil; and a cover formed to cover the inspection coil and the core with an insulating material having electrical insulation properties, in which, using a direction along the axial center of the inspection coil as the axial direction, a first side in the axial direction as an axial first side, a second side in the axial direction as an axial second side, directions orthogonal to the axial direction as radial directions, and a specific direction among directions along the radial directions as a specific radial direction, the cover includes: a coil cover portion formed to cover the inspection coil; and a projection portion disposed on the axial first side with respect to the coil cover portion and formed to project to both sides at least in the specific radial direction with respect to the coil cover portion, and, using an interval in design between the first feeder line and the second feeder line as a design interval, the dimension in the specific radial direction of the coil cover portion is smaller than the design interval and the dimension in the specific radial direction of the projection portion is larger than the design interval.

When the inspection coil covered with the coil cover portion is disposed between the first feeder line and the second feeder line for inspection, the induced electromotive force is generated in the inspection coil by the magnetic fields generated by the first feeder line and the second feeder line. A voltage generated by this induced electromotive force is output to the pair of output lines. Thus, the detection of the voltage between the pair of output lines enables the inspection of the magnitude of the magnetic fields generated by the first feeder line and the second feeder line and the inspection of whether the alternating current appropriately flows through the first feeder line and the second feeder line. Further, the dimension in the specific radial direction of the coil cover portion is smaller than the design interval and the dimension in the specific radial direction of the projection portion is larger than the design interval. Therefore, in the inspection, the projection portion is disposed at a position facing the first feeder line and the second feeder line from below with an orientation in which the coil cover portion is located above the projection portion, for example, so that the inspection coil covered with the coil cover portion can be disposed at an appropriate position between the first feeder line and the second feeder line. It is a matter of course that the projection portion is disposed at a position facing the first feeder line and the second feeder line from above with an orientation in which the coil cover portion is located below the projection portion, so that the inspection coil covered with the coil cover portion can also be disposed at an appropriate position between the first feeder line and the second feeder line. Further, the cover is formed to cover the inspection coil and the core with the insulating material. Therefore, even when the inspection device contacts the first feeder line or the second feeder line, a short circuit in the first feeder line or the second feeder line is avoided. More specifically, safe inspection can be realized. As described above, according to this configuration, an inspection device having excellent workability and safety in which a contactless power feeding facility is set as an inspection target can be provided. By the use of such an inspection device, an inspection method having excellent workability and safety can be provided.

It is suitable that the core includes: a winding portion which is disposed along the axial direction and around which the inspection coil is wound; and a projection core portion disposed on the axial first side with respect to the winding portion and formed to project to both sides at least in the specific radial direction with respect to the winding portion, and the projection core portion is disposed inside the projection portion of the cover.

As described above, the projection portion is disposed at the position facing the first feeder line and the second feeder line from below with the orientation in which the coil cover portion is located above the projection portion in the inspection, for example, so that the inspection coil covered with the coil cover portion can be disposed at an appropriate position between the first feeder line and the second feeder line. According to this configuration, the projection core portion of the core is disposed at the position facing the first feeder line and the second feeder line from below in the inspection. Similarly, the projection portion is disposed at the position facing the first feeder line and the second feeder line from above with the orientation in which the coil cover portion is located below the projection portion, so that the inspection coil covered with the coil cover portion can also be disposed at an appropriate position between the first feeder line and the second feeder line. According to this configuration, the projection core portion of the core is disposed at the position facing the first feeder line and the second feeder line from above in the inspection. In any case, the projection core portion can be disposed close to the first feeder line and the second feeder line, and therefore the induced electromotive force generated in the inspection coil is easily increased in the inspection and the inspection accuracy is easily enhanced.

It is suitable that the core further includes, using the above-described projection core as a first projection core portion, a second projection core portion disposed on the axial second side with respect to the winding portion and formed to project to both sides at least in the specific radial direction with respect to the winding portion, the cover further includes, in addition to the coil cover portion and the first projection portion as the projection portion covering the first projection core portion, a second projection portion covering the second projection core portion, and, using a direction orthogonal to both the axial direction and the specific radial direction as a second specific radial direction, the dimension in the second specific radial direction of the second projection portion is smaller than the design interval and the dimension in the specific radial direction of the second projection portion is larger than the design interval.

According to this configuration, the dimension in the second specific radial direction of the second projection portion is smaller than the design interval. Therefore, the second projection portion can pass between the first feeder line and the second feeder line along the vertical direction (axial direction) by setting the second specific radial direction of the second projection portion as a direction orthogonal to the first feeder line and the second feeder line. Then, after the second projection portion passes between the first feeder line and the second feeder line, the second projection portion is rotated 90° around the axis along the axial direction, so that the specific radial direction of the second projection portion becomes the direction orthogonal to the first feeder line and the second feeder line. Thus, in the inspection, the first projection core portion and the second projection core portion are disposed to sandwich the first feeder line and the second feeder line from both sides in the axial direction in the state where the inspection coil is disposed between the first feeder line and the second feeder line. Therefore, the induced electromotive force generated in the inspection coil is easily increased in the inspection and the inspection accuracy is easily enhanced.

It is suitable that the first feeder line is supported by a first support member, the second feeder line is supported by a second support member, the inspection device further includes a support body supporting the inspection coil, the core, and the cover, and a first abutting member having a first abutting surface abutting on the lower surface of the first support member and a second abutting member having a second abutting surface abutting on the lower surface of the second support member are supported by the support body.

As described above, the projection portion is disposed at the position facing the first feeder line and the second feeder line from below with the orientation in which the coil cover portion is located above the projection portion in the inspection, for example, so that the inspection coil covered with the coil cover portion can be disposed at an appropriate position between the first feeder line and the second feeder line. At this time, according to this configuration, only by causing the first abutting surface of the first abutting member to abut on the lower surface of the first support member and causing the second abutting surface of the second abutting member to abut on the lower surface of the second support member, the inspection coil covered with the coil cover portion can be easily disposed at an appropriate position between the first feeder line and the second feeder line.

Herein, it is suitable that the first abutting member and the second abutting member each are detachably supported by the support body.

According to this configuration, the first abutting member and the second abutting member can be easily replaced with those having different shapes or removed. Since the first abutting member and the second abutting member having appropriate shapes can be used depending on the structure, the inspection place, and the like of the contactless power feeding facility, and therefore the inspection device can be shared. Further, it is considered that at least one of the first abutting member and the second abutting member becomes an obstacle depending on the structure, the inspection place, and the like of the contactless power feeding facility. In such a case, the inspection can be flexibly carried out by removing the first abutting member and the second abutting member. As described above, according to this configuration, the inspection can be more simply performed by appropriately selecting the first abutting member and the second abutting member (including a case where the first abutting member and the second abutting member are not provided) according to the structure, the inspection place, and the like of the contactless power feeding facility.

It is suitable that the inspection device further includes a support body supporting the inspection coil, the core, and the cover, the support body includes a connection portion which is disposed on the axial first side with respect to the inspection coil and the core and to which an extension member is detachably connected, and the extension member is formed to extend from the support body to the axial first side along the axial direction in a state of being connected to the connection portion.

As described above, the projection portion is disposed at the position facing the first feeder line and the second feeder line from below with the orientation in which the coil cover portion is located above the projection portion in the inspection, for example, so that the inspection coil covered with the coil cover portion can be disposed at an appropriate position between the first feeder line and the second feeder line. At this time, even when the first feeder line and the second feeder line are disposed at a high place, for example, the connection of the extension member enables the disposition of the inspection coil covered with the coil cover portion at an appropriate position between the first feeder line and the second feeder line. It is a matter of course that, even in the case where the projection portion is disposed at the position facing the first feeder line and the second feeder line from above with the orientation in which the coil cover portion is located below the projection portion, when the first feeder line and the second feeder line are separated from the position of the operator, the connection of the extension member enables the easy disposition of the inspection coil covered with the coil cover portion at an appropriate position between the first feeder line and the second feeder line.

It is suitable that the inspection device further includes, using the cover, the inspection coil and the core covered with the cover, and the pair of output lines as a first inspection unit, a second inspection unit having the same configuration as the configuration of the first inspection unit, and, using each of the pair of output lines of the first inspection unit as a first output line and a second output line and each of the pair of output lines of the second inspection unit as a third output line and a fourth output line, the second output line of the first inspection unit and the third output line of the second inspection unit are connected such that the inspection coil of the first inspection unit and the inspection coil of the second inspection unit are connected in series in the same winding direction.

By individually disposing the first inspection unit and the second inspection unit in two different places in the direction along the moving route, the relationship between the induced electromotive forces generated in the inspection coils in the two places can be inspected. In the case where the first feeder line set, which is a first set of the first feeder line and the second feeder line, supplied with an alternating current from the first power supply and the second feeder line set, which is a second set of the first feeder line and the second feeder line, supplied with an alternating current from the second power supply are disposed side by side along the moving route of the mobile object, for example, when the phases of the alternating currents of the first feeder line set and the second feeder line set are significantly shifted, the power receiver may cause the shortage of the received power amount in the mobile object located in a transfer portion between the first feeder line set and the second feeder line set. According to this configuration, when the phases of the alternating currents of the first feeder line set and the second feeder line set are shifted, the voltage between the first output line of the first inspection unit and the fourth output line of the second inspection unit is low. Therefore, the presence or absence of a state in which the power receiver may cause the shortage of the received power amount described above can be appropriately inspected.

It is suitable that, when the inspection device includes the first inspection unit and the second inspection unit, a connection body connecting the first inspection unit and the second inspection unit is provided, the first inspection unit is rotatably supported around the axial center along the axial direction with respect to the connection body, and the second inspection unit is rotatably supported around the axial center along the axial direction with respect to the connection body.

When the first inspection unit and the second inspection unit are not connected, at least two operators are required in the inspection, one operator holding the first inspection unit and the other operator holding the second inspection unit. However, the connection of the first inspection unit and the second inspection unit with the connection body also enables one operator to hold both the inspection units. Therefore, the number of the operators in the inspection is easily kept small. Further, the first inspection unit and the second inspection unit are rotatable with respect to the connection body, and therefore the inspection units can be appropriately disposed in two places even in a place where the moving route is curved.

As one aspect, it is suitable that an inspection method for inspecting the contactless power feeding facility using the inspection device including the first inspection unit and the second inspection unit includes: when a plurality of feeder line sets which is a set of the first feeder line and the second feeder line is disposed side by side along the moving route, and a first feeder line set, which is a first set of the plurality of feeder line sets, and a second feeder line set, which is a second set of the plurality of feeder line sets, are disposed adjacent to each other in the contactless power feeding facility, carrying out an inspection unit disposing step of disposing the inspection coil of the first inspection unit between the first feeder line and the second feeder line of the first feeder line set, and disposing the inspection coil of the second inspection unit between the first feeder line and the second feeder line of the second feeder line set; and, after the inspection unit disposing step, a step of measuring the voltage between the first output line of the first inspection unit and the fourth output line of the second inspection unit.

In the case where the first feeder line set, which is a first set of the first feeder line and the second feeder line, supplied with an alternating current from the first power supply and the second feeder line set, which is a second set of the first feeder line and the second feeder line, supplied with an alternating current from the second power supply are disposed side by side along the moving route of the mobile object, when the phases of the alternating currents of the first feeder line set and the second feeder line set are significantly shifted, the power receiver may cause the shortage of the received power amount in the mobile object located in a transfer portion between the first feeder line set and the second feeder line set. According to this method, when the phases of the alternating currents of the first feeder line set and the second feeder line set are shifted, the voltage between the first output line of the first inspection unit and the fourth output line of the second inspection unit is low. Therefore, the presence or absence of a state in which the power receiver may cause the shortage of the received power amount described above can be appropriately inspected.

The invention claimed is:

1. An inspection device for a contactless power feeding facility comprising: a first feeder line and a second feeder line disposed parallel to each other along a moving route of a mobile object provided with a power receiver; and a power supply configured to supply an alternating current to the first feeder line and the second feeder line, and configured to cause a receiving coil of the power receiver to generate an induced electromotive force by magnetic fields generated by the first feeder line and the second feeder line, the inspection device comprising:
an inspection coil disposed between the first feeder line and the second feeder line for inspection and configured to generate the induced electromotive force by the magnetic fields generated by the first feeder line and the second feeder line;
a core around which the inspection coil is wound;

a pair of output lines individually connected to each of both ends of the inspection coil; and
a cover formed to cover the inspection coil and the core with an insulating material having electrical insulation properties, wherein:
using a direction along an axial center of the inspection coil as an axial direction, a first side in the axial direction as an axial first side, a second side in the axial direction as an axial second side, directions orthogonal to the axial direction as radial directions, and a specific direction among directions along the radial directions as a specific radial direction,
the cover comprises:
a coil cover portion formed to cover the inspection coil; and
a projection portion disposed on the axial first side with respect to the coil cover portion and formed to project to both sides at least in the specific radial direction with respect to the coil cover portion, and
using an interval in design between the first feeder line and the second feeder line as a design interval:
a dimension in the specific radial direction of the coil cover portion is smaller than the design interval, and
a dimension in the specific radial direction of the projection portion is larger than the design interval.

2. The inspection device according to claim 1,
wherein the core comprises:
a winding portion which is disposed along the axial direction and around which the inspection coil is wound; and
a projection core portion disposed on the axial first side with respect to the winding portion and formed to project to both sides at least in the specific radial direction with respect to the winding portion, and
wherein the projection core portion is disposed inside the projection portion of the cover.

3. The inspection device according to claim 2,
wherein the core further comprises:
using the projection core as a first projection core portion, and
a second projection core portion disposed on the axial second side with respect to the winding portion and formed to project to both sides at least in the specific radial direction with respect to the winding portion,
wherein the cover further comprises:
in addition to the coil cover portion and the first projection portion as the projection portion covering the first projection core portion, a second projection portion covering the second projection core portion, and
using a direction orthogonal to both the axial direction and the specific radial direction as a second specific radial direction, and
wherein a dimension in the second specific radial direction of the second projection portion is smaller than the design interval, and a dimension in the specific radial direction of the second projection portion is larger than the design interval.

4. The inspection device according to claim 1,
wherein the first feeder line is supported by a first support member, and the second feeder line is supported by a second support member, and
wherein the inspection device further comprises:
a support body configured to support the inspection coil, the core, and the cover, and
a first abutting member having a first abutting surface abutting on a lower surface of the first support member and a second abutting member having a second abutting surface abutting on a lower surface of the second support member are supported by the support body.

5. The inspection device according to claim 4,
wherein the first abutting member and the second abutting member each are detachably supported by the support body.

6. The inspection device according to claim 1, further comprising:
a support body configured to support the inspection coil, the core, and the cover,
wherein the support body comprises a connection portion which is disposed on the axial first side with respect to the inspection coil and the core and to which an extension member is detachably connected, and
wherein the extension member is formed to extend from the support body to the axial first side along the axial direction in a state of being connected to the connection portion.

7. The inspection device according to claim 1, further comprising:
using the cover, the inspection coil and the core covered with the cover, and the pair of output lines as a first inspection unit, and
a second inspection unit having a same configuration as a configuration of the first inspection unit, and
wherein, using each of the pair of output lines of the first inspection unit as a first output line and a second output line and each of the pair of output lines of the second inspection unit as a third output line and a fourth output line:
the second output line of the first inspection unit and the third output line of the second inspection unit are connected such that the inspection coil of the first inspection unit and the inspection coil of the second inspection unit are connected in series in a same winding direction.

8. The inspection device according to claim 7, further comprising:
a connection body connecting the first inspection unit and the second inspection unit,
wherein the first inspection unit is rotatably supported around the axial center along the axial direction with respect to the connection body, and
wherein the second inspection unit is rotatably supported around the axial center along the axial direction with respect to the connection body.

9. An inspection method for inspecting the contactless power feeding facility using the inspection device according to claim 7,
the contactless power feeding facility comprising a plurality of feeder line sets which is a set of the first feeder line and the second feeder line disposed side by side along the moving route, and a first feeder line set, which is a first set of the plurality of feeder line sets, and a second feeder line set, which is a second set of the plurality of feeder line sets, disposed adjacent to each other,
the inspection method comprising:
an inspection unit disposing step of disposing the inspection coil of the first inspection unit between the first feeder line and the second feeder line of the first feeder line set, and disposing the inspection coil of the second inspection unit between the first feeder line and the second feeder line of the second feeder line set; and after the inspection unit disposing step, a step of measuring a voltage between the first output line of the first inspection unit and the fourth output line of the second inspection unit.

\* \* \* \* \*